United States Patent
Kodama et al.

(10) Patent No.: US 11,909,423 B2
(45) Date of Patent: Feb. 20, 2024

(54) COMPRESSION CIRCUIT, STORAGE SYSTEM, AND COMPRESSION METHOD

(71) Applicant: Kioxia Corporation, Tokyo (JP)

(72) Inventors: Sho Kodama, Kawasaki (JP); Keiri Nakanishi, Kawasaki (JP); Daisuke Yashima, Tachikawa (JP)

(73) Assignee: Kioxia Corporation, Tokyo (JP)

( * ) Notice: Subject to any disclaimer, the term of this patent is extended or adjusted under 35 U.S.C. 154(b) by 151 days.

(21) Appl. No.: 17/693,606

(22) Filed: Mar. 14, 2022

(65) Prior Publication Data

US 2023/0081961 A1 Mar. 16, 2023

(30) Foreign Application Priority Data

Sep. 16, 2021 (JP) ................. 2021-151334

(51) Int. Cl.
*H03M 7/30* (2006.01)
*G06F 3/06* (2006.01)
*H03M 7/40* (2006.01)

(52) U.S. Cl.
CPC ........ *H03M 7/3088* (2013.01); *G06F 3/0608* (2013.01); *G06F 3/0659* (2013.01); *G06F 3/0679* (2013.01); *H03M 7/40* (2013.01)

(58) Field of Classification Search
None
See application file for complete search history.

(56) References Cited

U.S. PATENT DOCUMENTS

| | | | |
|---|---|---|---|
| 8,704,686 B1 | 4/2014 | Agarwal et al. | |
| 9,203,887 B2 | 12/2015 | Gopal et al. | |
| 2007/0255891 A1* | 11/2007 | Chow | G06F 13/161 711/103 |
| 2017/0235497 A1* | 8/2017 | Shih | G06F 3/0608 711/154 |
| 2017/0249105 A1* | 8/2017 | Yang | G06F 3/0608 |
| 2019/0207624 A1 | 7/2019 | Cassetti et al. | |
| 2020/0228148 A1* | 7/2020 | Thomas | H03M 7/6023 |

* cited by examiner

*Primary Examiner* — Charles Rones
*Assistant Examiner* — Jonah C Krieger
(74) *Attorney, Agent, or Firm* — Oblon, McClelland, Maier & Neustadt, L.L.P.

(57) ABSTRACT

According to one embodiment, a compression circuit generates substrings from input data for (3+M) cycles, the input data being N bytes per cycle, a byte length of each substring being greater than or equal to (N×(1+M)+1); obtains a set of matches, each of the matches including at least one past input data which input past and corresponds to at least a part of each of the substrings; selects a subset of matches from the set of matches including the input data of one cycle; and outputs the subset of matches. M is zero or a natural number. N is a positive integer which is two or more.

13 Claims, 10 Drawing Sheets

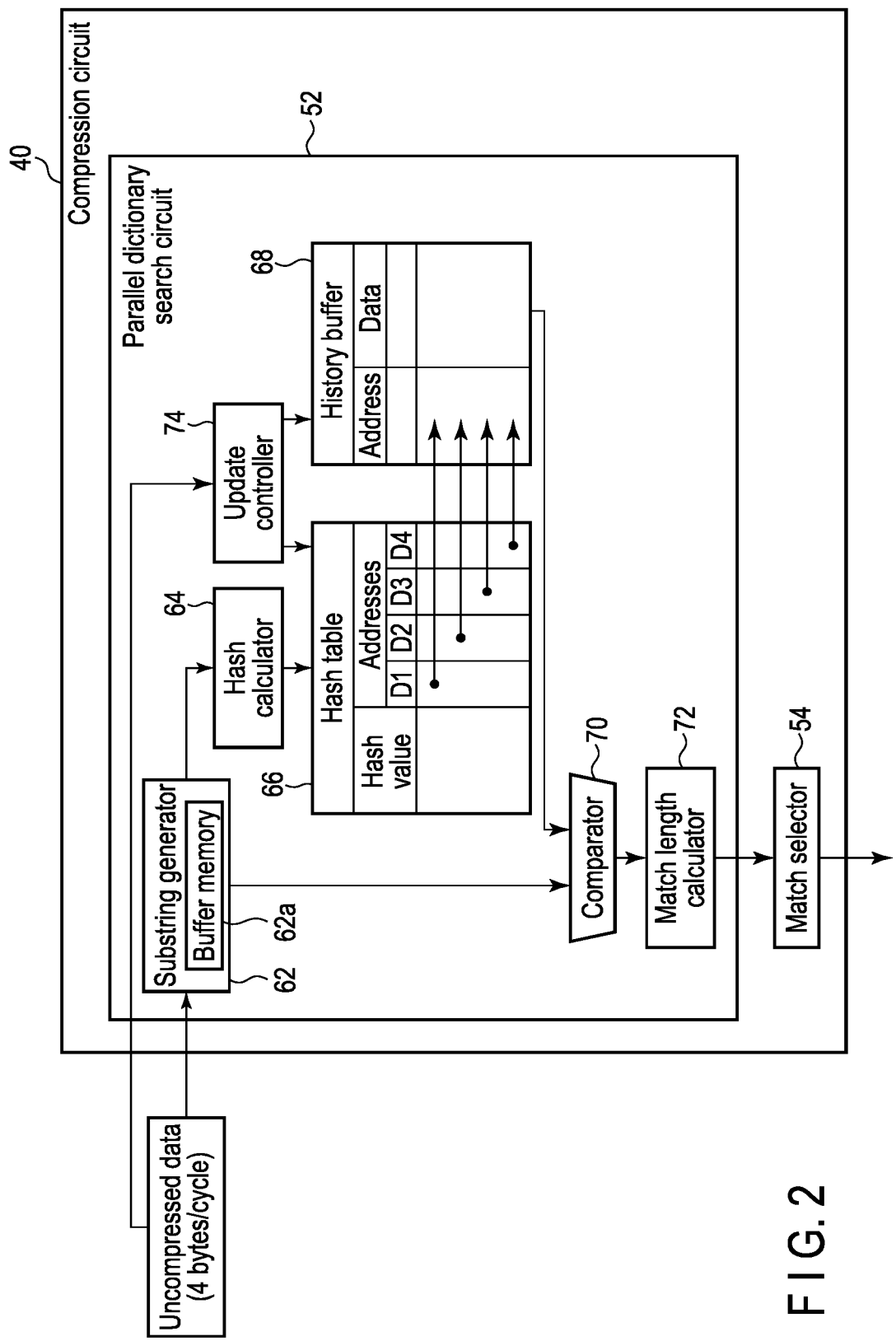
F I G. 2

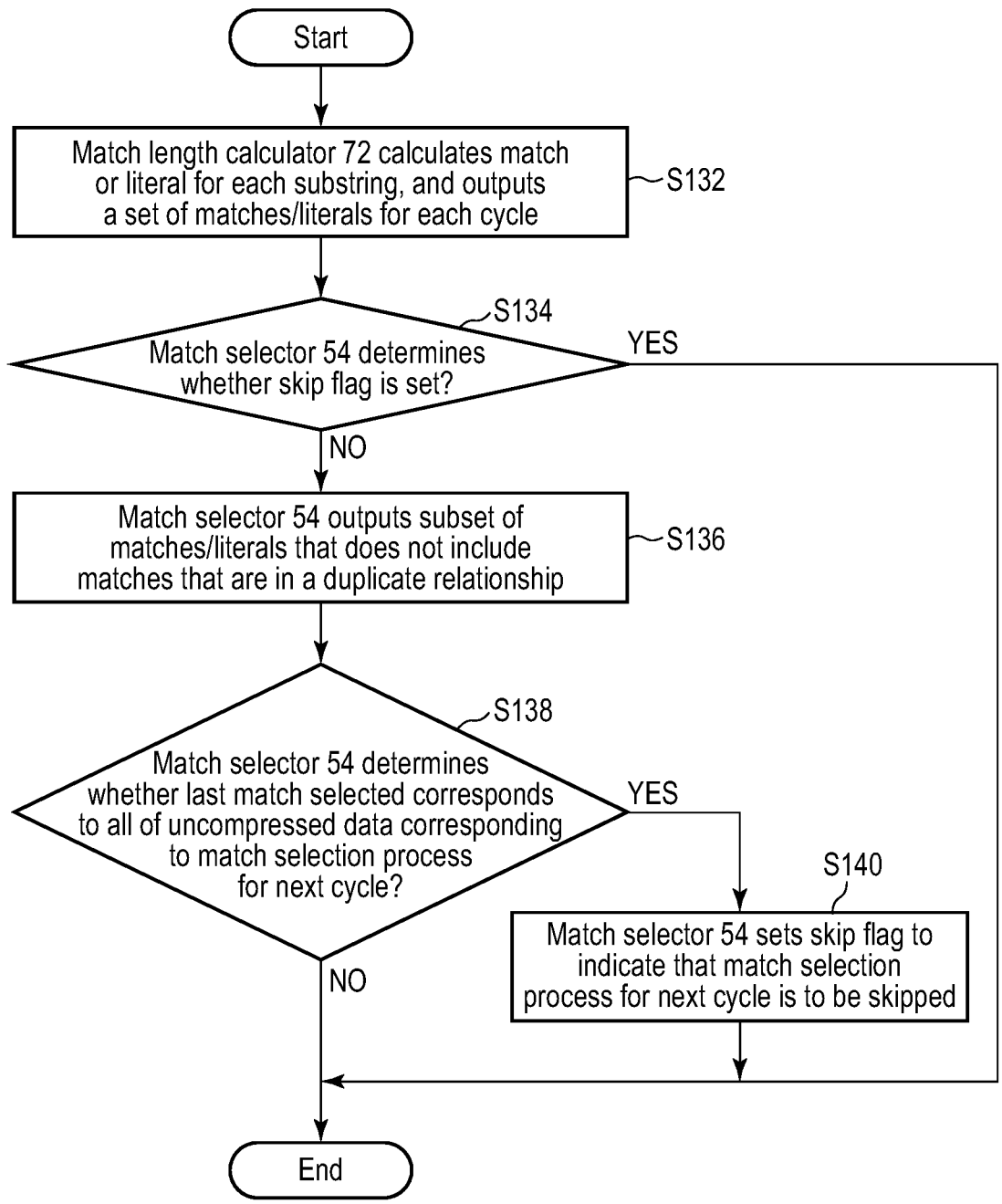
F I G. 7

COMPRESSION CIRCUIT, STORAGE SYSTEM, AND COMPRESSION METHOD

CROSS-REFERENCE TO RELATED APPLICATIONS

This application is based upon and claims the benefit of priority from Japanese Patent Application No. 2021-151334, filed Sep. 16, 2021, the entire contents of which are incorporated herein by reference.

FIELD

Embodiments described herein relate generally to a compression circuit, storage system, and compression method.

BACKGROUND

As a technique of compressing data, a dictionary type compression based on reference to a history buffer, represented by LZ77, is known. The history buffer is a buffer memory storing past data. Past data that matches at least a part of the input data is searched in the buffer memory. If the past data matching at least a part of the input data is stored in the buffer memory, the input data is converted to a match, which is reference information to the buffer memory. A match is a pair of a length of the past data matching at least a part of the input data and position information that identifies the past data matching at least a part of the input data. The past data matching at least a part of the input data is referred to as match data. The length of the match data is referred to as a match length. The information indicates how long ago in the past the match data was input as seen from the current input data.

The size of the match data is smaller than the size of the input data. The input data can be compressed and encoded by converting the input data to the match and encoding the match instead of the input data.

As a technique to realize a dictionary-type compression with high throughput, it has been considered to generate multiple substrings from the input data, and to perform a parallel dictionary search for past data matching the multiple substrings.

However, in this technique, when the throughput becomes lower, the compression performance becomes lower.

BRIEF DESCRIPTION OF THE DRAWINGS

FIG. 2 is a block diagram for explaining the compression circuit 40 according to the first embodiment.

FIG. 7 is a flowchart illustrating an example of processing for one output cycle of the compression circuit 40 according to the first embodiment.

DETAILED DESCRIPTION

Figure 1:
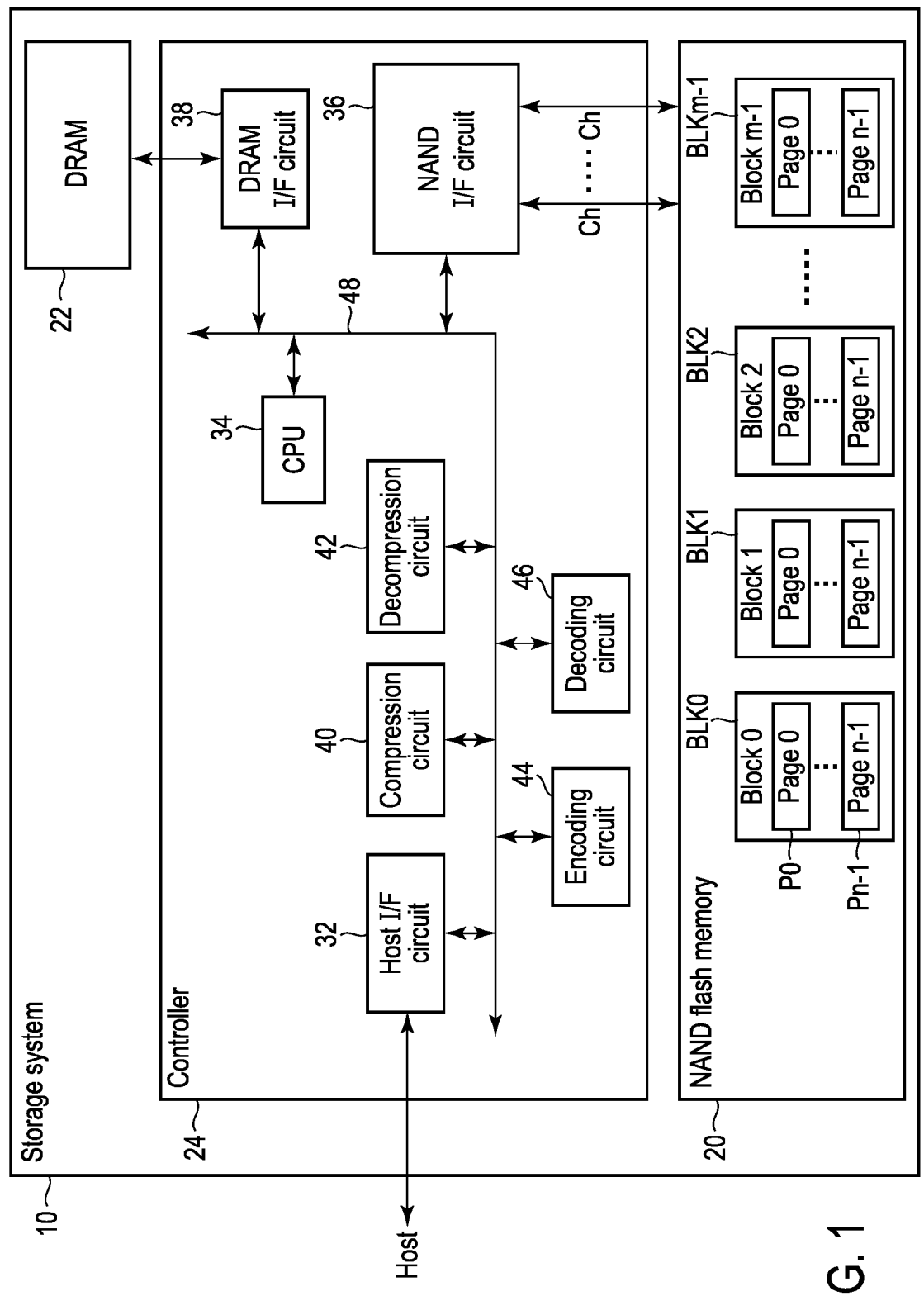
FIG. 1 is a block diagram illustrating an example of a storage system 10 with a compression circuit 40 according to a first embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a compression circuit generates substrings from input data for (3+M) cycles, the input data being N bytes per cycle, a byte length of each substring being greater than or equal to $(N \times (1+M)+1)$; obtains a set of matches, each of the matches including at least one past input data which input past and corresponds to at least a part of each of the substrings; selects a subset of matches from the set of matches including the input data of one cycle; and outputs the subset of matches. M is zero or a natural number. N is a positive integer which is two or more.

First Embodiment

FIG. 1 is a block diagram illustrating an example of a storage system 10 with a compression circuit according to a first embodiment.

The storage system 10 can be connected to a host, which is not shown in the figure. The host is an information processing device that accesses the storage system 10. The storage system 10 may be used as a main storage of the host. The storage system 10 may be built to the host, or may be provided outside the host and connected to the host via a cable or network. The host may be a server (storage server) that stores a large amount and variety of data in the storage system 10. The host may be a personal computer. The storage system 10 may be a system for business use that is incorporated to a server in a data center or the like. The storage system 10 may be a system for personal use that is incorporated to a personal computer. The storage system 10 may be referred to as a solid state drive (SSD).

The storage system 10 includes a NAND flash memory 20, dynamic random access memory (DRAM) 22, and controller 24.

The NAND flash memory 20 is an example of a nonvolatile memory. Instead of the NAND flash memory 20, a NOR flash memory, magneto-resistive random access memory (MRAM), phase change random access memory (PRAM), resistive random access memory (ReRAM), ferroelectric random access memory (FeRAM) may be used.

The NAND flash memory 20 includes a memory cell array including a plurality of memory cells arranged in a matrix. The memory cell array may be a two-dimensional structure or a three-dimensional structure.

The memory cell array of NAND flash memory 20 includes a plurality of blocks BLK0 to BLKm-1, wherein m is a positive integer of two or more. Each of the blocks BLK0 to BLKm-1 includes a plurality of pages (in this case, pages P0 to Pn-1), wherein n is a positive integer of two or more. The blocks BLK0 to BLKm-1 function as erase units. Each of the pages P0 to Pn-1 includes a plurality of memory cells connected to the same word line. Pages P0 to Pn-1 are units for data write operation and data read operation.

DRAM 22 is an example of a volatile memory. The DRAM 22 is, for example, a double data rate 3 low voltage (DDR 3L) DRAM. DRAM 22 includes a write buffer, read buffer, management information buffer, and the like. The write buffer stores data that is supplied from the host to the storage system 10 and is in the process of being written to the NAND flash memory 20 or data is supplied from the host to the storage system 10 and has not yet been written to the NAND flash memory 20. The read buffer stores data that is read from NAND flash memory 20 and is being transmitted to the host or data that is read from NAND flash memory 20 and has not yet been transmitted to the host. The management information buffer stores lookup tables and various other tables and various values used during operation of the storage system 10. The DRAM 22 also serves as a temporary buffer for software executed in the controller 24.

The DRAM 22 is not provided external to the controller 24, but it may be provided inside the controller 24. As a volatile memory, instead of the DRAM 22, a faster-accessible static random access memory (SRAM) may be used.

The controller 24 is configured to write data to the NAND flash memory 20 and read data from the NAND flash memory 20 according to a command (or request) transmitted from the host. The controller 24 may be a circuit such as system on a chip (SoC).

The controller 24 has a function to control the operation of the storage system 10. The controller 24 includes a host interface (referred to as a host I/F circuit) 32, CPU 34, NAND interface (referred to as the NAND I/F circuit) 36, DRAM interface (referred to as DRAM I/F circuit) 38, compression circuit 40, decompression circuit 42, encoding circuit 44, and decoding circuit 46. The host I/F circuit 32, CPU 34, NAND I/F circuit 36, DRAM I/F circuit 38, compression circuit 40, decompression circuit 42, encoding circuit 44, and decoding circuit 46 are connected to each other via a bus 48.

The storage system 10 compresses uncompressed data transmitted from the host by the compression circuit 40, encodes the compressed data by the encoding circuit 44, and writes the encoded data to the NAND flash memory 20. The storage system 10 decodes the encoded data read from the NAND flash memory 20 by the decoding circuit 46 into compressed data, and the compressed data is decompressed by the decompression circuit 42 to generate uncompressed data to be transmitted to the host.

The host I/F circuit 32 is configured to perform communication with the host. The communication with the host is performed, for example, according to the PCI Express™ standard. The host I/F circuit 32 receives commands from the host.

The CPU 34 is a processor configured to control the host I/F circuit 32, NAND I/F circuit 36, DRAM I/F circuit 38, compression circuit 40, decompression circuit 42, encoding circuit 44, and decoding circuit 46. The CPU 34 loads, in response to power-on of the storage system 10, control program (firmware) from the NAND flash memory 20 or read only memory (ROM) which is not shown into the DRAM 22, and performs various processes by executing the control program. The CPU 34 can execute processing for various requests from the host. The operation of the CPU 34 is controlled by the control program executed by the CPU 34. Some or all of the processing for the commands from the host may be executed by a specific hardware in the controller 24.

The NAND I/F circuit 36 is a memory control circuit configured to control the NAND flash memory 20 under the control of CPU 34. The NAND I/F circuit 36 and NAND flash memory 20 are connected through a plurality of channels Ch. The NAND flash memory 20 includes a plurality of memory chips. The memory chips are connected to each channel.

The DRAM I/F circuit 38 is a DRAM control circuit configured to control the DRAM 22 under the control of CPU 34.

The compression circuit 40 compresses the input data (uncompressed data) by a dictionary type compression, and outputs the compressed data. The encoding circuit 44 encodes the compressed data output from the compression circuit 40. One example of encoding is entropy encoding such as Huffman encoding. The encoded compressed data output from the encoding circuit 44 is written to the NAND flash memory 20. Furthermore, the encoded compressed data may be subjected to predetermined processing such as error correction processing and randomization processing. In that case, the CPU 34 may write the data for which the predetermined processing has been executed for the encoded compressed data to the NAND flash memory 20 via the NAND I/F circuit 36. That is, the CPU 34 may write data based on the encoded compressed data output from the encoding circuit 44 to the NAND flash memory 20.

The decoding circuit 46 decodes the encoded compressed data read from the NAND flash memory 20. The decompression circuit 42 decompresses the compressed data decoded in the decoding circuit 46, and outputs the uncompressed data. The CPU 34 reads, when reading the encoded compressed data from the NAND flash memory 20 based on the read command received from the host via the NAND I/F circuit 36, data based on the read command from the NAND flash memory 20 via the NAND I/F circuit 36. The data read from the NAND flash memory 20 may be subject to specific processing such as error correction processing, randomization cancellation processing, and then, may be input to the decoding circuit 46 by the CPU 34 as the encoded compressed data. The decoding circuit 46 may decode the encoded compressed data, and the decompression circuit 42 may decompress the compressed data. That is, the decoding circuit 46 may decode the encoded compressed data based on the data read from the NAND flash memory 20.

It has been described that the compression circuit 40, decompression circuit 42, encoding circuit 44, and decoding circuit 46 are realized by a dedicated circuit (SoC). The decompression circuit 40, decompression circuit 42, encoding circuit 44, and decoding circuit 46 may be realized by the CPU 34 executing a compression or decompression program (firmware). It has been described that the compression circuit 40 and decompression circuit 42 are incorporated in the controller 24 of the storage system 10; however, one or both of the compression circuit 40 and decompression circuit 42 may be external to the storage system 10 (e.g., in the host).

As a technique to realize a dictionary type compression with high throughput, it is considered to generate a plurality of substrings from input data and to perform a parallel dictionary search for past data matching the plurality of substrings. The past data matching the plurality of substrings is also referred to as match data. For example, uncompressed data input at a throughput of N bytes/cycle is buffered in a buffer memory for two cycles. First data of N bytes is read from a read start address of the buffer memory as a first substring. Second and subsequent data of N bytes are read from the buffer memory as second and subsequent substrings by shifting the read start address of the buffer memory by one byte. Thus N substrings of N bytes are generated.

High throughput dictionary search is achieved by performing dictionary search processing on the N substrings in parallel. In this technique, the length of the substring is N bytes and the throughput is N bytes/cycle. Therefore, the maximum match length detected by the substring parallel dictionary search is also N bytes. This means that the maximum match length becomes shorter when the throughput is low. In general, the compression performance of dictionary type compression tends to be higher when the maximum match length is longer. In this technique, when the throughput is lower, the compression performance becomes lower.

FIG. 2 is a block diagram for explaining a compression circuit 40 according to the first embodiment. The compression circuit 40 includes a parallel dictionary search circuit 52, and a match selector 54. The parallel dictionary search circuit 52 generates a plurality of substrings from the input data, performs dictionary search processing on the plurality of substrings in parallel, and outputs a plurality of matches for each substring.

The match selector 54 removes duplicate matches, if any, from the plurality of matches output from the parallel dictionary search circuit 52, and selects matches that are fewer than the number of matches output from the parallel dictionary search circuit 52, and outputs the selection result. If there are no duplicate matches among the plurality of matches output from the parallel dictionary search circuit 52, the match selector 54 outputs the plurality of matches output from the parallel dictionary search circuit 52 as they are.

The parallel dictionary search circuit 52 includes a substring generator 62, hash calculator 64, hash table 66, history buffer 68, comparator 70, match length calculator 72, and update controller 74.

The uncompressed data to be compressed is input to the substring generator 62 and the history buffer 68. The throughput of compression circuit 40 is assumed to be 4 bytes/cycle. 4-byte uncompressed data is input to the compression circuit 40 per cycle.

The history buffer 68 is a ring buffer that stores uncompressed data that has been input in the past. The size of the history buffer 68 is, for example, 4 KiB. That is, if a word of the uncompressed data corresponds to 4 bytes, the history buffer 68 stores the uncompressed data of 1024 most recently input words. The update controller 74 sequentially writes the 4-byte uncompressed data to the history buffer 68 every cycle.

The substring generator 62 generates four substrings based on the 4-byte uncompressed input data. The length of the substring is longer than the length of the throughput.

Figure 3:
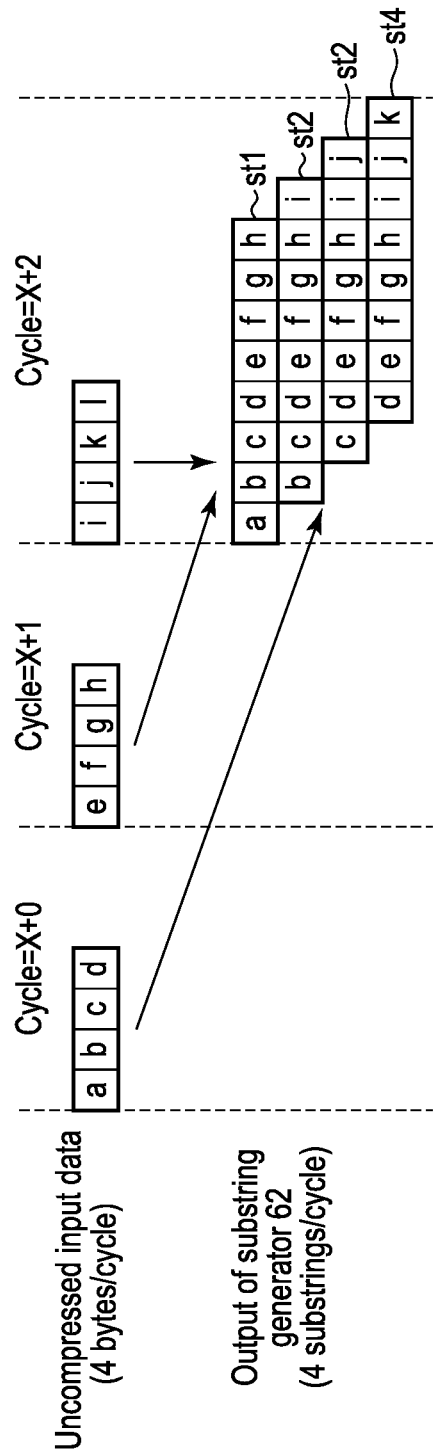
FIG. 3 is a diagram illustrating the operation of a substring generator 62 according to the first embodiment.

FIG. 3 is a diagram illustrating the operation of the substring generator 62 according to the first embodiment. The substring generator 62 is configured to generate a substring which is longer than the throughput. For example, the length of the substring is an 8-byte. A length of 8-byte is twice the length of the throughput. The substring generator 62 includes a buffer memory 62a that stores three cycles of 4-byte uncompressed data input at each input cycle. The uncompressed data may be of any type, such as text data, image data, and the like.

In a cycle "X+0" of data input, the substring generator 62 writes the 4-byte uncompressed input data "a", "b", "c", and "d" sequentially to the buffer memory 62a.

In an input cycle "X+1", the substring generator 62 writes the 4-byte uncompressed input data "e", "f", "g", and "h" sequentially to the buffer memory 62a. At the point when the uncompressed data "h" is written to the buffer memory 62a, the buffer memory 62a stores 8-byte uncompressed data "a", "b", "c", "d", "e", "f", "g", and "h". Thus the substring generator 62 can generate an 8-byte substring at the end of the input cycle "X+1".

In an input cycle "X+2", the substring generator 62 writes the 4-byte uncompressed input data "i", "j", "k", and "l" sequentially to the buffer memory 62a.

The substring generator 62 writes the first uncompressed input data "i" in the input cycle "X+2" to the buffer memory 62a, and reads the first uncompressed input data "a" in the input cycle "X+0" from the buffer memory 62a. The substring generator 62 sets the uncompressed data "a" as the first byte of a substring st1.

The substring generator 62 writes the second uncompressed input data "j" in the input cycle "X+2" to the buffer memory 62a, and reads the second uncompressed input data "b" in the input cycle "X+0" from the buffer memory 62a. The substring generator 62 sets the uncompressed data "b" as the first byte of a second substring st2, and also as the second byte of the first substring st1. The first byte "b" of the second substring st2 differs from the first byte of the first substring st1 by one byte position in the series of uncompressed data input.

The substring generator 62 writes the third uncompressed input data "k" in the input cycle "X+2" to the buffer memory 62a, and reads the third uncompressed input data "c" in the input cycle "X+0" from the buffer memory 62a. The substring generator 62 sets the uncompressed data "c" as the first byte of a third substring st3, and also as the second byte of the second substring st2, and the third byte of the first substring st1.

The substring generator 62 writes the fourth uncompressed input data "l" in the input cycle "X+2" to the buffer memory 62a, and reads the fourth uncompressed input data "d" in the input cycle "X+0" from the buffer memory 62a. The substring generator 62 sets the uncompressed data "d" as the first byte of a fourth substring st4, and also the second byte of the third substring st3, and the third byte of the second substring st2, and the fourth byte of the first substring st1.

The substring generator 62 reads the uncompressed data "e" from the buffer memory 62a. The substring generator 62 sets the uncompressed data "e" as the second byte of the fourth substring st4, and also the third byte of the third substring st3, the fourth byte of the second substring st2, and the fifth byte of the first substring st1.

Thereafter, in the same manner, the substring generator 62 generates the first substring st1 including uncompressed data "a" to "h", second substring st3 including uncompressed data "b" to "i", third substring st3 including uncompressed data "c" to "j", and fourth substring st4 including uncompressed data "d" to "k".

Conventionally, when the throughput is low, the compression performance is degraded because the maximum match length cannot be increased. However, the substring generator 62 of the first embodiment generates a substring with a length twice the throughput, which improves the compression performance.

Referring to the description of FIG. 2, the first to fourth substrings st1 to st4 generated by the substring generator 62 are input to a hash calculator 64 and a comparator 70.

The hash calculator 64 calculates four hash values from the first 4 bytes of the first to fourth substrings st1 to st4, respectively. The hash calculator 64 transmits the calculated hash values to the hash table 66.

The hash table 66 stores the address of the history buffer 68 being associated with the hash value. The hash value is a read pointer of the hash table 66. The hash table 66 can store at most four addresses D1, D2, D3, and D4 as the addresses of the history buffer 68 corresponding to the hash value.

The update policy of the hash table 66 when the four addresses D1 to D4 are written (registered) to the hash table 66 is first-in first-out (FIFO). When a new address of the history buffer 68 is to be written to the hash table 66 while the four addresses D1 to D4 are stored for a hash value, the most previously written address D4 is discarded and the addresses D1, D2, and D3 are set to the addresses D2, D3, and D4, respectively, and a new address is written as the address D1. As a result, the newly written address D1 is stored longer in the history buffer 68.

When registering the addresses D1 to D4 in the hash table 66, the hash value is used as the address (write pointer) in the same way as in the reading. When the update controller 74 writes the uncompressed data to the history buffer 68, the update controller 74 writes the address of the history buffer 68 to the hash table 66 while associating with the hash value of the substring generated from the uncompressed data. When the update controller 74 writes the address D1 to the hash table 66, the update controller 74 discards the address D4, sets the addresses D1, D2, and D3 to the addresses D2, D3, and D4, respectively, and writes the address D1. Thus the addresses D1 to D4 of the hash table 66 correspond to four addresses of the history buffer 68 in which four 4-byte uncompressed data with high matching possibility to the first 4 bytes of the substring.

When the hash value is transmitted from the hash calculator 64 to the hash table 66, the addresses D1 to D4 corresponding to the hash value are read from the hash table 66 and then transmitted to the history buffer 68.

When the addresses D1 to D4 are transmitted from the hash table 66 to the history buffer 68, uncompressed data corresponding to the addresses D1 to D4 are read from the history buffer 68 and then transmitted to the comparator 70.

The comparator 70 compares the first to fourth substrings st1 to st4 generated by the substring generator 62 with the uncompressed data output from the history buffer 68, and detects at least a part of the uncompressed data that matches at least a part of the first to fourth substrings st1 to st4, respectively. Since the length of the substring is eight bytes and a word of the uncompressed data corresponds to 4 bytes, the comparator 70 forms the uncompressed data of two words into an 8-byte uncompressed data, and then compares the first to fourth substrings st1 to st4 with the 8-byte uncompressed data. The comparator 70 detects some or all of the uncompressed data matching with the one byte, two bytes, . . . , and eight bytes from the first byte of the substring, respectively.

For each substring, the comparator 70 transmits at least a part of the uncompressed data that matches at least a part of the substring and the address of the part of the uncompressed data to the match length calculator 72.

If there is no uncompressed data that matches at least a part of the substring, the comparator 70 transmits non-match information to the match length calculator 72.

The match length calculator 72 outputs, for each substring, a match based on at least the part of the uncompressed data (match data) and its address which are transmitted from the comparator 70. The match is a pair of the match length and the position information. The match length is the number of bytes of the match data. The position information is an address of the first byte of the match data. Since the length of the substring is eight bytes, the maximum value of the match length is eight bytes (twice the throughput).

When the match length calculator 72 receives the non-match information for a substring from the comparator 70, the match length calculator 72 outputs first byte of the substring. This first byte is referred to as a literal, as distinguished from the match. The literal is not compressed. The match length calculator 72, in other words, parallel dictionary search circuit 52, outputs a set of four matches/literals per cycle.

When a plurality of matches are output from the parallel dictionary search circuit 52, the matches may have an overlapping relationship. An overlapping relationship means that the uncompressed data corresponding to the matches overlap with each other. If the first match corresponds to uncompressed data α and β, and the second match corresponds to uncompressed data α, the uncompressed data α is compressed by the first match. There is no need to compress the uncompressed data α by the second match. It is not necessary to use the second match. The match selector 54 selects, from the set of matches/literals output from the parallel dictionary search circuit 52, a subset of matches/literals whose corresponding uncompressed data do not overlap with each other. The match selector 54 may select two matches with a match length of two bytes to encompass 4-byte uncompressed data. The match selector 54 transmits the selection results to the encoding circuit 44. The subset of matches/literals selected by the match selector 54 is not limited to plural matches. The subset of matches/literals may include a single match.

Figure 4:
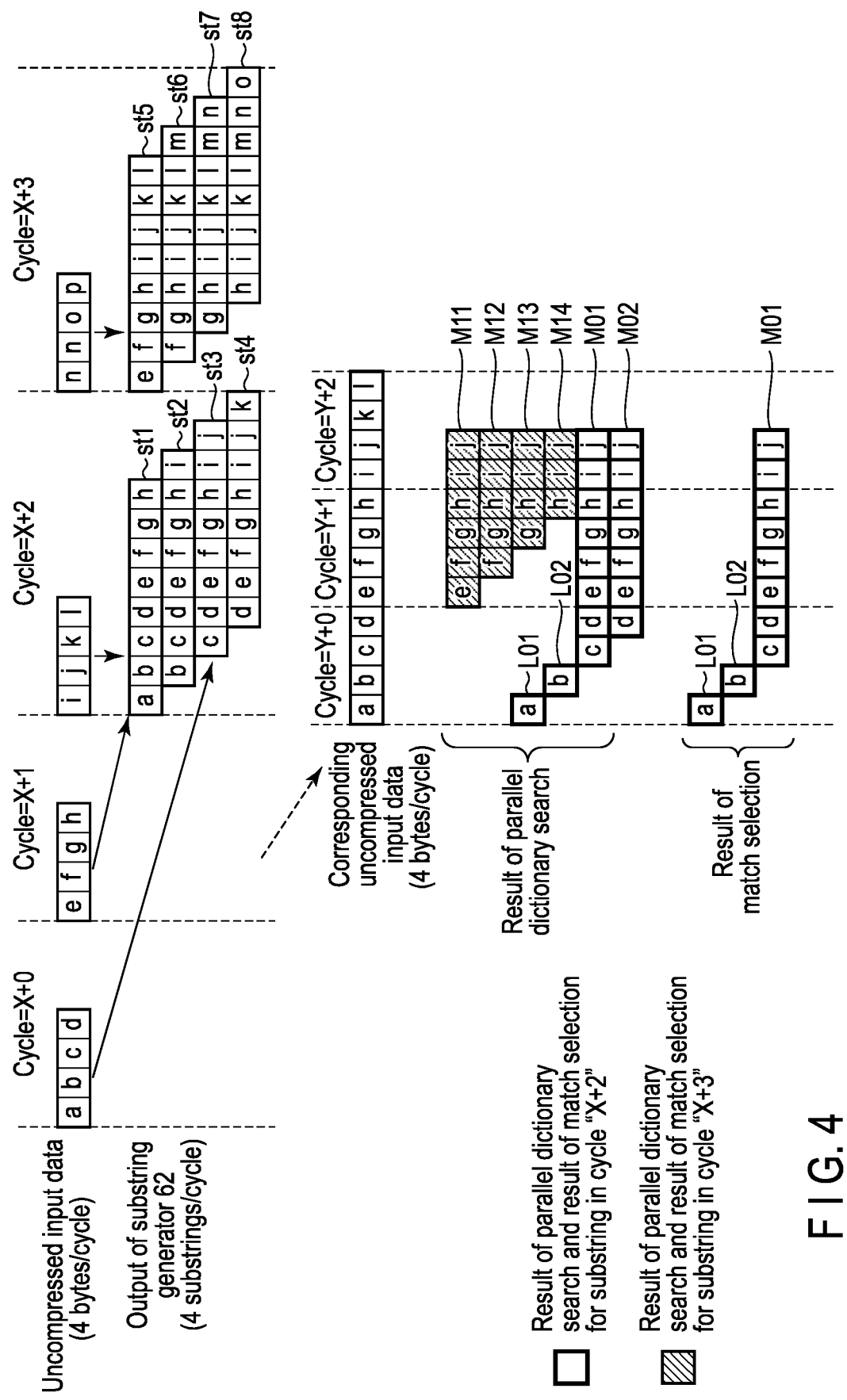
FIG. 4 is a diagram illustrating the operation of the compression circuit 40 according to the first embodiment.

FIG. 4 is a diagram illustrating the operation of the compression circuit 40 according to the first embodiment. As described with reference to FIG. 3, the substring generator 62 generates substrings of twice the length of the throughput.

In other words, in the input cycle "X+0", the substring generator 62 sequentially writes the 4-byte uncompressed input data "a", "b", "c", and "d" to the buffer memory 62a.

In the input cycle "X+1", the substring generator 62 writes the 4-byte uncompressed input data "e", "f", "g", and "h" sequentially to the buffer memory 62a.

In the input cycle "X+2", the substring generator 62 sequentially writes the 4-byte uncompressed input data "i", "j", "k", and "l" to the buffer memory 62a. The substring generator 62 generates the first substring st1 including the uncompressed data "a" to "h", second substring st2 including the uncompressed data "b" to "i", third substring st3 including the uncompressed data "c" to "j", and fourth substring st4 including the uncompressed data "d" to "k".

In an input cycle "X+3", the substring generator 62 sequentially writes 4-byte uncompressed input data "m", "n", "o", and "p" to the buffer memory 62a. The substring generator 62 generates a fifth substring st5 including the uncompressed data "e" to "l", sixth substring st6 including the uncompressed data "f" to "m", seventh substring st7 including the uncompressed data "g" to "n", and eighth substring st8 including the uncompressed data "h" to "o".

In an output cycle "Y+0" of the compression circuit 40, the parallel dictionary search circuit 52 outputs a set of matches/literals of a literal L01 including the uncompressed data "a", literal L02 including the uncompressed data "b", first match M01 including the uncompressed data "c" to "j", and second match M02 including the uncompressed data "d" to "j", for each of the substrings st1 to st4 generated in the input cycle "X+2".

The uncompressed data "c" to "j" included in the first match M01 output from the parallel dictionary search circuit 52 in the output cycle "Y+0" include all of the uncompressed data "d" to "j" included in the second match M02. The match selector 54 assigns matches/literals in order from the first byte of the uncompressed data. Therefore, the match selector 54 selects, in the output cycle "Y+0", a subset of matches/literals of the literal L01 including the uncompressed data "a", literal L02 including the uncompressed data "b", and first match M01 including the uncompressed data "c" to "j".

In an output cycle "Y+1", the parallel dictionary search circuit 52 outputs, with respect to each of the substrings st5 to st8 generated in the input cycle "X+3", a set of matches/literals of a first match M11 including the uncompressed data "e" to "j", second match M12 including the uncompressed data "f" to "j", third match M13 including the uncompressed data "g" to "j", and fourth match M14 including the uncompressed data "h" to "j".

Since the length of the substring is twice the throughput, and the maximum match length is also twice the throughput, it is possible that a subset of matches/literals selected by the match selector 54 in one cycle may include all of the uncompressed data corresponding to the selection process for the next cycle. For example, in the example of FIG. 4, the uncompressed data "c" to "j" included in the first match M01 selected in the output cycle "Y+0" include all of the uncompressed data "e" to "h" corresponding to the selection process for the next cycle "Y+1". This means that, as a result that the first match M01 including the uncompressed data "c" to "j" in the output cycle "Y+0", matches have already been selected for (or assigned to) all of the uncompressed data "e" to "h" corresponding to the output cycle "Y+1". Therefore, there is no need to perform the selection process in the output cycle "Y+1", or if it is performed, incorrect compression will be performed.

Thus, upon detection of a case where the last match selected in the selection process of a cycle (in the example of FIG. 4, the first match M01 selected in the output cycle "Y+0", including the uncompressed data "c" to "j") corresponds to all of the uncompressed data corresponding to the selection process for the next cycle (in the example of FIG. 4, the uncompressed data "e" to "h" corresponding to the selection process in the output cycle "Y+1"), the match selector 54 does not execute the selection process for the next cycle, and skips it. The match selector 54 skips the selection process in the output cycle "Y+1", and does not output any of the first match M11 including the uncompressed data "e" to "j", the second match M12 including the uncompressed data "f" to "j", third match M13 including the uncompressed data "g" to "j", and fourth match M14 including the uncompressed data "h" to "j".

Figure 5:
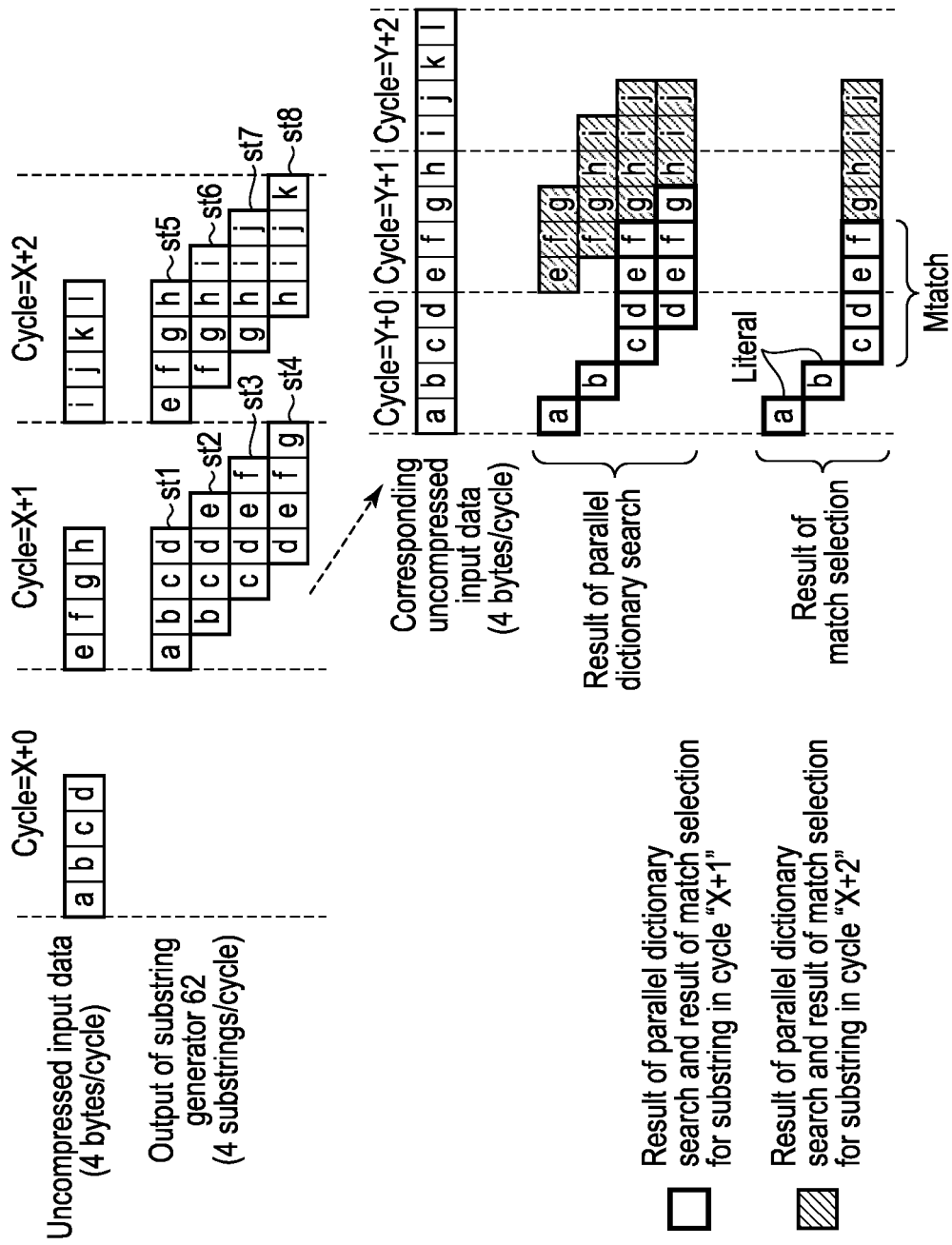
FIG. 5 is a diagram illustrating a dictionary type compression operation of a comparative example in which a throughput is 4 bytes/cycle, a length of the substring is 4 bytes, and a maximum match length is 4 bytes.

A comparative example will be described to illustrate the effect of the first embodiment. FIG. 5 is a diagram illustrating a dictionary type compression operation of the comparative example in which the throughput is 4 bytes/cycle, the length of the substring is 4 bytes, and the maximum match length is also 4 bytes. The length of the substring is different between the comparative example and the first embodiment, but the structure of the compression circuit is the same as that of FIG. 2.

In the input cycle "X+0", 4-byte uncompressed data "a" to "d" are input.

In the input cycle "X+1", 4-byte uncompressed data "e" to "h" are input; and a first substring st1 including the uncompressed data "a" to "d", second substring st2 including the uncompressed data "b" to "e", and third substring st3 including the uncompressed data "c" to "f", and fourth substring st4 including the uncompressed data "d" to "g" are generated.

In the input cycle "X+2", 4-byte uncompressed data "i" to "l" are input; and a fifth substring sty including the uncompressed data "e" to "h", sixth substring st6 including the uncompressed data "f" to "i", seventh substring st7 including the uncompressed data "g" to "j", and eighth substring st8 including the uncompressed data "h" to "k" are generated.

In the output cycle "Y+0", with respect to each of the first to fourth substrings st1 to st4 generated in the input cycle "X+0", a literal including the uncompressed data "a", literal including the uncompressed data "b", first match including the uncompressed data "c" to "f", and second match including the uncompressed data "d" to "g" are output as the result of parallel dictionary search.

In the output cycle "Y+0", with respect to the uncompressed data "a" to "d", a literal including the uncompressed data "a", literal including the uncompressed data "b", and first match including the uncompressed data "c" to "f" are output as the match selection result. The selected match may include uncompressed data of a next cycle. In FIG. 5, the uncompressed data "c" to "f" in the first match include some "e" and "f" of the uncompressed data "e" to "h" corresponding to the input cycle "X+1". In other words, up to the uncompressed data "e" and "f" of the input cycle "X+1", they are associated with a match in the output cycle "Y+0". Therefore, the match selection in the output cycle "Y+1" starts with an assignment to the uncompressed data "g".

In the selection process of each cycle, the match or literal is assigned to at least 4-byte uncompressed input data corresponding to the substring. Thus a throughput of 4 bytes/cycle is achieved. However, since the length of the substring is 4 bytes, the maximum match length is also 4 bytes. When the throughput becomes lower, the compression performance becomes lower.

If the throughput is doubled to 8 bytes/cycle in the comparative example, the maximum match length of the comparative example and the first embodiment will be equal. Thus the compression performance will be equivalent. However, if the throughput is doubled, the gate scale of the circuit becomes larger than that of the first embodiment due to the doubled throughput in the hash value calculation process, the hash table registration/read process, the history buffer read process, and the match length calculation process. Therefore, the first embodiment can achieve higher compression performance than the comparative example at the same throughput. The first embodiment can be implemented with a smaller gate scale than the comparative example when compared with the same level of compression performance.

Figure 6:
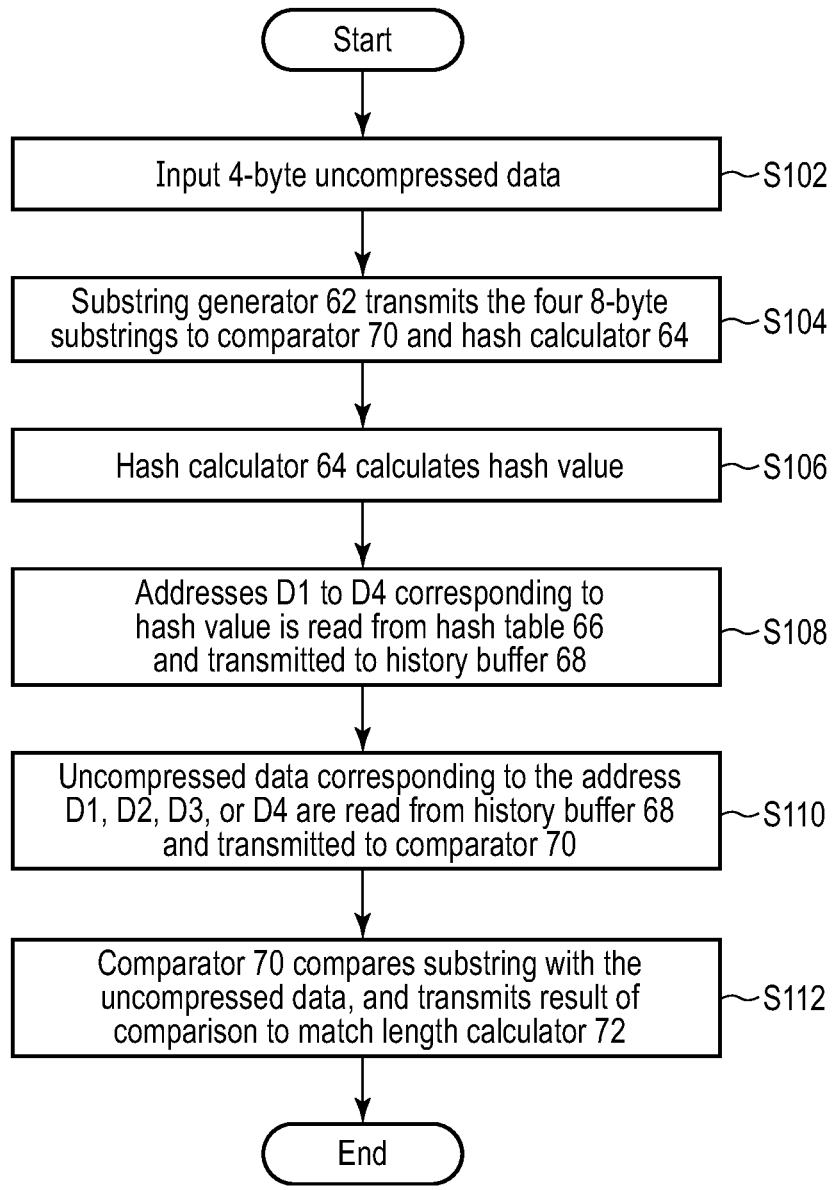
FIG. 6 is a flowchart illustrating an example of processing of one input cycle of the compression circuit 40 according to the first embodiment.

FIG. 6 is a flowchart illustrating an example of processing of one input cycle of the compression circuit 40 according to the first embodiment.

When the processing of one input cycle starts, in step S102, 4-byte uncompressed data is input to the compression circuit 40.

In step S104, the substring generator 62 writes four uncompressed input data to the buffer memory 62a, reads an 8-byte substring for two cycles by changing the read position one byte at a time, and generates four 8-byte substrings. The substring generator 62 transmits the four 8-byte substrings to the comparator 70 and hash calculator 64.

In step S106, the hash calculator 64 calculates a hash value from the first 4 bytes of each substring.

In step S108, the addresses D1 to D4 corresponding to the hash value is read from the hash table 66 and transmitted to the history buffer 68.

In step S110, the uncompressed input data corresponding to the address D1, D2, D3, or D4 are read from the history buffer 68 and transmitted to the comparator 70.

At step S112, the comparator 70 compares the substring with the uncompressed input data, and transmits the result of the comparison to the match length calculator 72. The comparison result is at least a part of the uncompressed input data stored in the history buffer 68 and its address for a substring in which at least the part of the uncompressed input data matches at least a part of the substring. For a substring in which no part of the uncompressed input data matches at least a part of the substring, the comparison result is the non-match information.

Each process of steps S106, S108, S110, and S112 is performed in parallel for a plurality of substrings generated by the substring generator 62.

After step S112, the process for one input cycle ends.

FIG. 7 is a flowchart illustrating an example of processing for one output cycle of the compression circuit 40 according to the first embodiment.

Once the processing of one output cycle begins, in step S132, the match length calculator 72 calculates the match or literal for each substring, and outputs a set of four matches/literals for each cycle.

In step S134, the match selector 54 determines whether a skip flag is set.

If the skip flag is set (YES in step S134), the process for one output cycle ends.

If the skip flag is not set (NO in step S134), in step S136, the match selector 54 selects, from the set of matches/literals output from the match length calculator 72, a subset of matches/literals that does not include matches that are in a duplicate relationship, and outputs the subset of matches/literals.

At step S138, the match selector 54 determines whether the last match selected most recently includes all of the uncompressed data corresponding to the selection process for the next cycle.

If the last match does not include all of the uncompressed data corresponding to the selection process for the next cycle, the process of one output cycle is ended.

If the last match includes all of the uncompressed data corresponding to the selection process for the next cycle, at step S140, the match selector 54 sets the skip flag to indicate that the selection process for the next cycle is to be skipped.

After step S140, the process of one output cycle ends.

According to the first embodiment, the uncompressed data is input at a throughput of 4 bytes/cycle. The substring generator 62 buffers the uncompressed input data for three cycles, and generates four 8-byte substrings per cycle. The length of the substring is twice the throughput. The match length calculator 72 sets the maximum match length to 8. Therefore, the compression circuit 40 according to the first embodiment is capable of detecting longer matches when compared with the comparative example with aligned throughput, and thus achieving higher compression performance. When the first embodiment is compared with the comparative example with the throughput doubled, the maximum match length of both is equal, and thus the compression performance is equivalent. However, in the comparative example where the throughput is doubled, the gate scale also increases. When the compression circuit 40 according to the first embodiment is compared with the comparative example with the same level of compression performance, the gate scale can be smaller than that of the comparative example.

Second Embodiment

Figure 8:
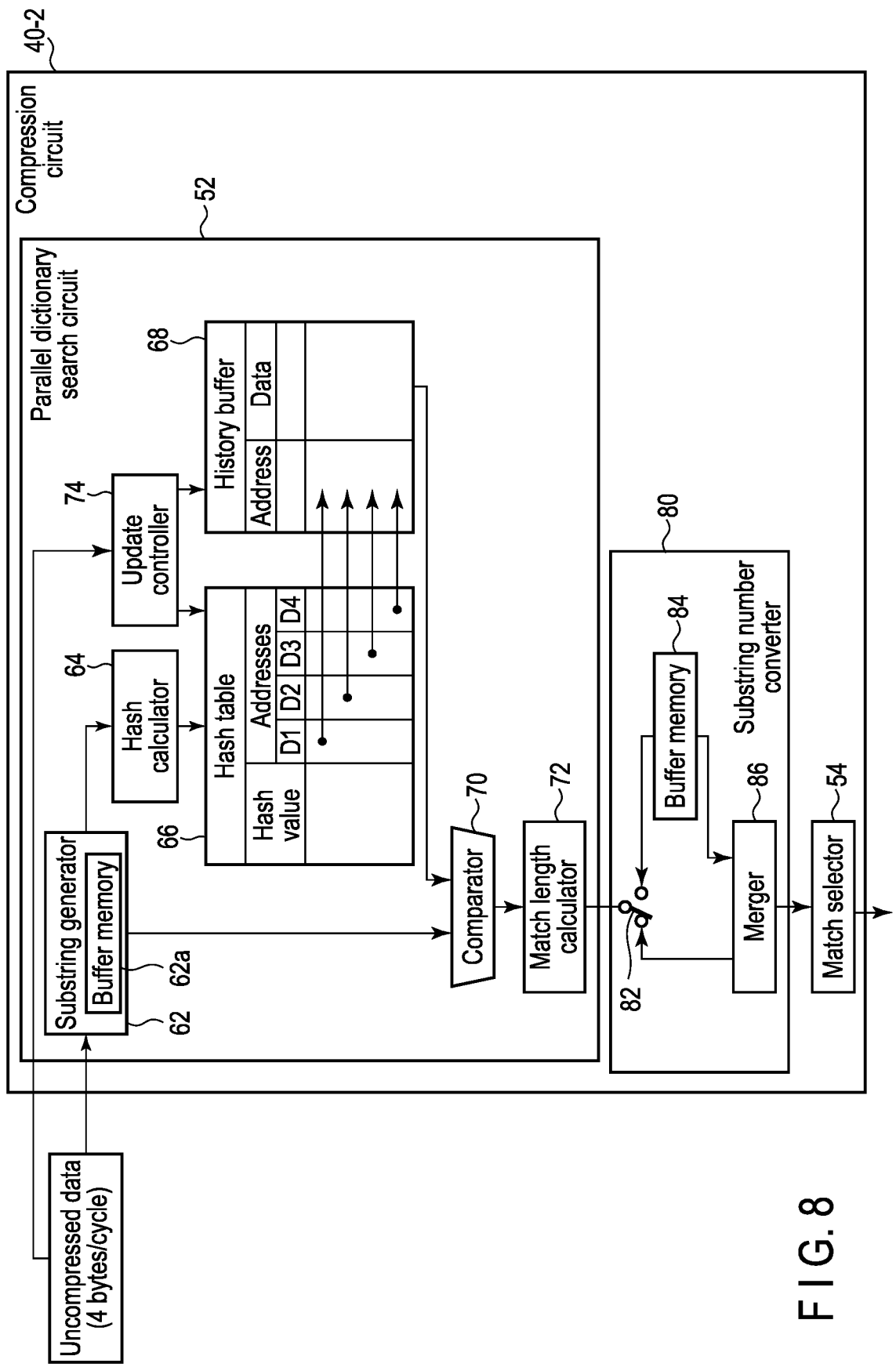
FIG. 8 is a block diagram illustrating a compression circuit 40-2 according to a second embodiment.

FIG. 8 is a block diagram illustrating a compression circuit 40-2 according to a second embodiment. The same reference numerals are attached to the same components as in the first embodiment, and the description will be omitted. The compression circuit 40-2 includes the parallel dictionary search circuit 52, the match selector 54, and a substring number converter 80. The substring number converter 80 includes a selector 82, buffer memory 84, and merger 86. The parallel dictionary search circuit 52 outputs a set of four matches/literals as a search result for each output cycle. The selector 82 switches every cycle, and transmits the search result to the buffer memory 84 and the merger 86, alternately. Thus, the search result for one cycle is written to the buffer memory 84 once every two cycles. For example, in an odd-numbered output cycle, the search result of the parallel dictionary search circuit 52 for one cycle is written to the buffer memory 84. In the next even-numbered output cycle, the search result of the previous cycle is read from the buffer memory 84. The search result of the current cycle (a set of four matches/literals) and the search result of the previous cycle (a set of four matches/literals) are merged in the merger 86. The merged result is output. That is, the substring number converter 80 merges the search results for two cycles and outputs a set of eight matches/literals for every two cycles.

Figure 9:
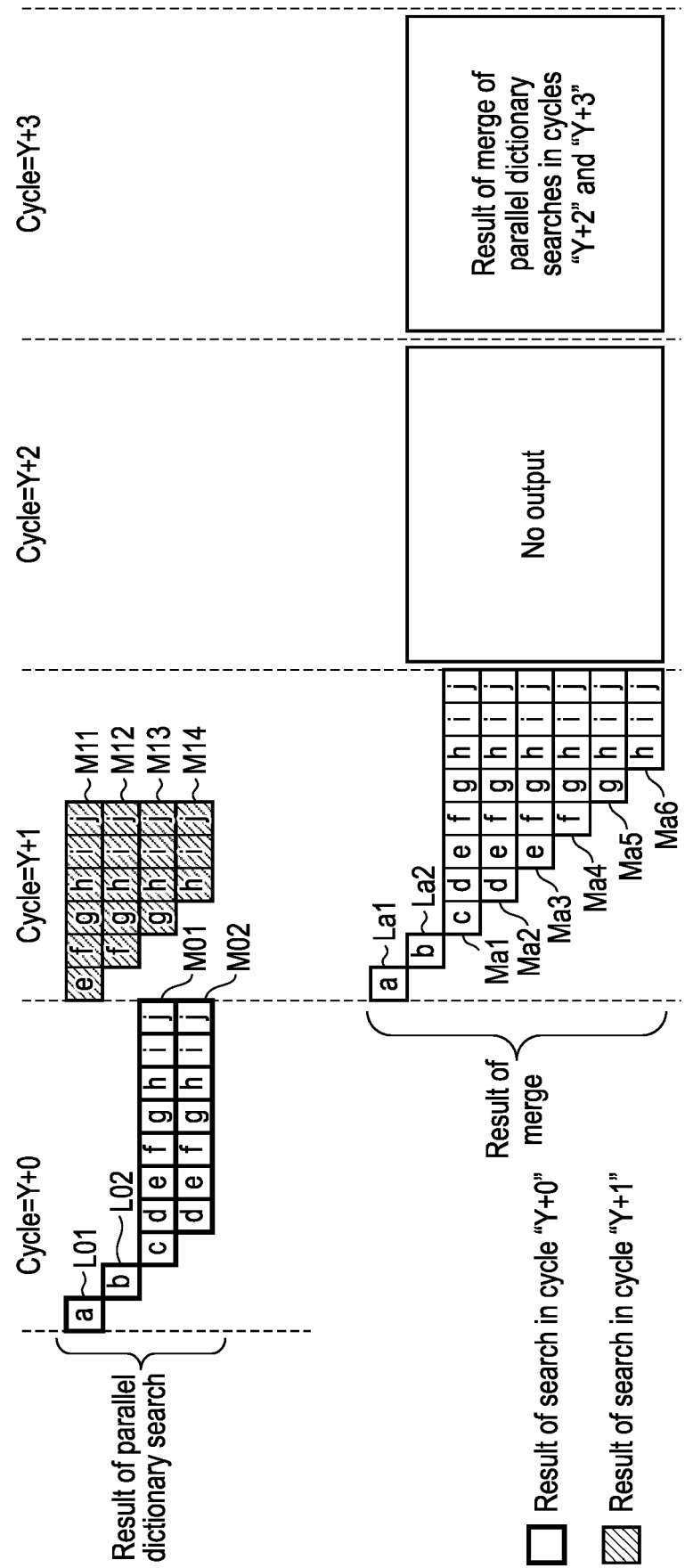
FIG. 9 is a diagram illustrating the operation of a substring number converter 80 according to the second embodiment.

FIG. 9 is a diagram illustrating the operation of the substring number converter 80 according to the second embodiment.

In the output cycle "Y+0", the parallel dictionary search circuit 52 outputs, with respect to the substrings st1 to st4, a set of matches/literals (a search result) of a literal L01 including the uncompressed data "a", literal L02 including the uncompressed data "b", first match M01 including the uncompressed data "c" to "j", and second match M02 including the uncompressed data "d" to "j" to the substring number converter 80. The search result is stored in the buffer memory 84 by switching by the selector 82.

In the output cycle "Y+1", the parallel dictionary search circuit 52 outputs, with respect to each of the substrings st1 to st4, a set of matches/literals (a search result) of a match M11 including the uncompressed data "e" to "j", match M12 including the uncompressed data "f" to "j", match M13 including the uncompressed data "g" to "j", match M14 including the uncompressed data "h" to "j" to the substring number converter 80. The search result is output to the merger 86 by switching by the selector 82. In the output cycle "Y+1", the merger 86 reads the literals L01 and L02, and the matches M01 and M02 from the buffer memory 84. The substring number converter 80 merges the literals L01 and L02, matches M01 and M02, and matches M11, M12, M13, and M14 input in the output cycle "Y+1". The substring number converter 80 transmits a merge result of literals La1 and La2, matches Ma1, Ma2, Ma3, Ma4, Ma5, and Ma6 to the match selector 54. The literals La1 and La2 and matches Ma1, Ma2, Ma3, Ma4, Ma5, and Ma6 of the merge result respectively correspond to the literals L01 and L02, and matches M01, M02, M11, M12, M13, and M14 output from the parallel dictionary search circuit 52, respectively.

In the output cycle "Y+2", the search result (not shown in FIG. 9) output by the parallel dictionary search circuit 52 is written to the buffer memory 84. For this reason, no merge result is output in the output cycle "Y+2".

In an output cycle "Y+3", the search result of the output cycle "Y+3" output by the parallel dictionary search circuit 52 (not shown in FIG. 9) and the search result of the output cycle "Y+2" read from the buffer memory 84 are transmitted to the merger 86. For this reason, the search result of the output cycle "Y+2" and the search result of the output cycle "Y+3" are merged and output in the output cycle "Y+3".

Figure 10:
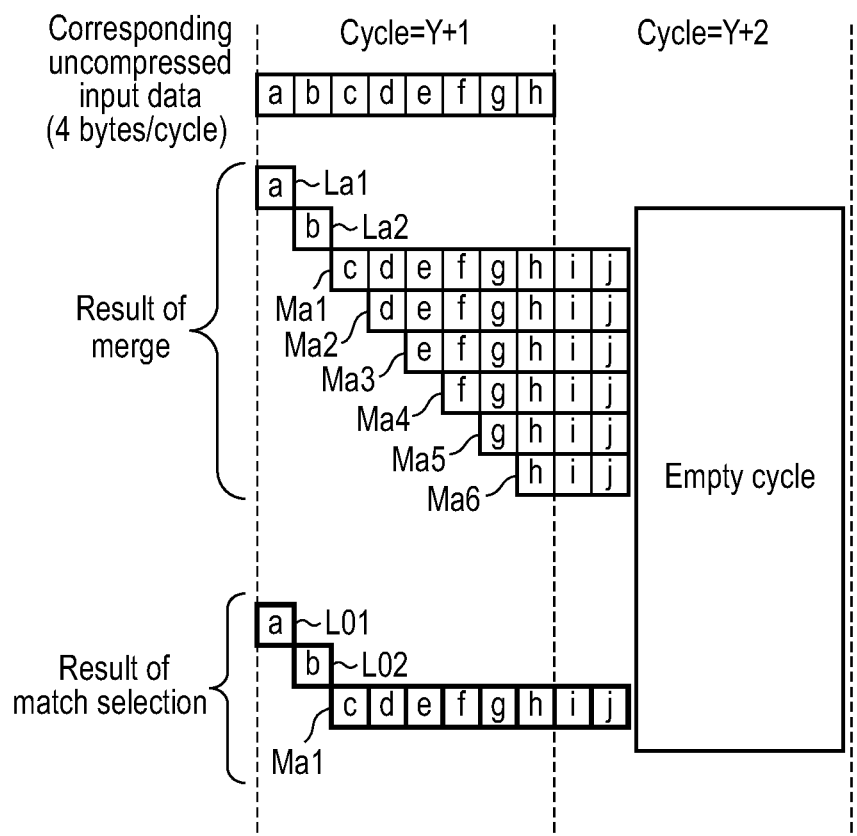
FIG. 10 is a diagram illustrating the operation of the match selector 54 according to the second embodiment.

FIG. 10 is a diagram illustrating the operation of the match selector 54 according to the second embodiment.

In the output cycle "Y+1", the substring number converter 80 outputs the literals La1 and La2, and matches Ma1, Ma2, Ma3, Ma4, Ma5, and Ma6.

In the output cycle "Y+1", the match selector 54 selects a subset of matches/literals including the literal La1 and La2, and match Ma1. Since the subset of literals La1, La2, and match Ma1 corresponds to all of the eight bytes of the uncompressed data "a" to "h" corresponding to the output cycle "Y+1", the match selector 54 ends the selection process after selecting the match Ma1.

According to the second embodiment, four substrings are input per cycle. The parallel dictionary search results with a maximum match length of 8 for the substrings are merged for two cycles, and converted to a parallel dictionary search result with a maximum match length of 8 for eight substrings. Match selection is also changed to perform the selection process for the parallel dictionary search result with the maximum match length of 8 for eight substrings once in two cycles. In that case, a match selection can be performed in the same way as when the throughput is set to 8 bytes/cycle in the match selection of the comparative example (FIG. 9). However, the processing rate is halved to once every two cycles.

In the case of the second embodiment, a situation in which all of the uncompressed data corresponding to the next match selection process are covered by the match selected in one cycle of the selection process does not occur. Therefore, in the second embodiment, there is no need for the process of detecting the occurrence of such a situation and skipping the next match selection process as in the first embodiment.

The substring generator 62 of the first and second embodiments includes the buffer memory 62a storing the uncompressed data of adjacent three cycles in order to generate 8-byte substring which is twice as long as the throughput of 4 bytes/cycle. The substring generator 62 may generate a substring which is three times or more as long as the throughput, instead of twice. If buffer memory 62a is configured to store uncompressed data of adjacent (3+M) cycles, the substring generator 62 can generate substrings that are at least (N×(1+M)+1) bytes in length which is longer than N. Here, M is zero or a natural number, in other words a non-negative integer, and N is a positive integers which is two or more and represents the throughput. In the example of FIG. 3, the size of the substring is (N×(M+2)) bytes where N=4 and M=0. In FIG. 3, the size of the substring is 8 (=4×2) bytes.

The buffer memory 62a stores uncompressed data input in cycle C to uncompressed data input in cycle (C+2+M). The substring generator 62 generates a partial byte string of a byte length (N×(1+M)+1) or more as a substring from the data stored in the buffer memory 62a. The substring generator 62 generates a plurality of substrings in which the positions of the partial byte strings differ.

The first and second embodiments are described in a case where M is 0. By setting M to one or more, the size of the substring, i.e., the maximum match length can be increased to more than three times the throughput, which further improves the compression efficiency.

When the substring generator 62 generates a substring with a length of (N×(1+M)+1) bytes, if the last match selected most recently among the selected subset of matches/literals includes all of the uncompressed data for (1+k) cycles starting from the next cycle, the match selector 54 sets the skip flag representing skipping a match selection process for (1+k) cycles from the next cycle. Here, k is a positive integer less than or equal to M and greater than or equal to 0 (0≤k≤M).

The substring number converter 80 according to the second embodiment merges the parallel dictionary search results for two cycles, but the number of cycles to be merged is not limited to two, and it may be any positive integer of three or more. In other words, the substring number converter 80 may merge the parallel dictionary search results for Y cycles. Here, Y is a positive integer of two or more. This allows the match selector 54 to select a subset of matches/literals including at least (N×Y) bytes of uncompressed data from the merged parallel dictionary search results.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modification as would fall within the scope and spirit of the inventions.

What is claimed is:

1. A compression circuit, comprising:
 a processor configured to
  generate substrings from input data for (3+M) cycles, the input data being N bytes per cycle, a byte length of each substring being greater than or equal to (N×(1+M)+1);
  obtain a set of matches, each of the matches including at least one past input data which input past and corresponds to at least a part of each of the substrings;
  select a subset of matches from the set of matches including the input data of one cycle; and
  output the subset of matches, wherein
 M is zero or a natural number, and N is a positive integer which is two or more.

2. The compression circuit of claim 1, further comprising a buffer memory configured to store the input data for (3+M) cycles, and wherein
 the processor is configured to generate the substrings, each of the substring being at least (N×(1+M)+1) bytes of the input data stored in the buffer memory at different storing positions.

3. The compression circuit of claim 1, further comprising a ring buffer configured to store the input data, and wherein
 the processor is configured to search the input data stored in the ring buffer in parallel for the matches.

4. The compression circuit of claim 1, wherein
the processor is configured to skip outputting of the subset of matches for (1+k) cycles from a next cycle if a last match selected most recently in a current cycle corresponds to a match for the (1+k) cycles from the next cycle, and
k is equal to or less than M and is a positive integer which is zero or more.

5. The compression circuit of claim 1, wherein
the processor is configured to merge sets of matches obtained for Y cycles and to output a merged set of matches once per the Y cycles, and
the processor is configured to select a subset of matches corresponding to the input data of at least (N×Y) bytes from the merged set of matches, and
Y is a positive integer.

6. The compression circuit of claim 1, wherein
the processor is configured to generate the substrings, a byte length of each substring being N×(M+2).

7. A storage system comprising:
a nonvolatile memory; and
a controller configured to control data write to the nonvolatile memory and data read from the nonvolatile memory, wherein
the controller comprises:
    the compression circuit of claim 1; and
    an encoder configured to encode the subset of matches, and write and encoded subset of matches to the nonvolatile memory.

8. A compression method, comprising:
generating substrings from input data for (3+M) cycles, the input data being N bytes per cycle, a byte length of each substring being greater than or equal to (N×(1+M)+1);
obtaining a set of matches, each of the matches including at least one past input data which input past and corresponds to at least a part of each of the substrings;
selecting a subset of matches from the set of matches including the input data of one cycle; and
outputting the subset of matches, wherein
M is zero or a natural number, and N is a positive integer which is two or more.

9. The compression method of claim 8, further comprising:
writing the input data for (3+M) cycles to a buffer memory; and
generating the substrings, each of the substring being at least (N×(1+M)+1) bytes of the input data stored in the buffer memory at different storing positions.

10. The compression method of claim 8, further comprising:
writing the input data to a ring buffer; and
searching the input data stored in the ring buffer in parallel for the matches.

11. The compression method of claim 8, further comprising:
skipping outputting of the subset of matches for (1+k) cycles from a next cycle if a last match selected most recently in a current cycle corresponds to a match for the (1+k) cycles from the next cycle, wherein
k is equal to or less than M and is a positive integer which is zero or more.

12. The compression method of claim 8, further comprising:
merging sets of matches obtained for Y cycles;
outputting a merged set of matches once per the Y cycles; and
selecting a subset of matches corresponding to the input data of at least (N×Y) bytes from the merged set of matches, wherein
Y is a positive integer.

13. The compression method of claim 8, wherein
a byte length of each substring being N×(M+2).

* * * * *